(12) United States Patent
Tong et al.

(10) Patent No.: US 11,185,139 B1
(45) Date of Patent: Nov. 30, 2021

(54) COATING COMPOSITIONS AND METHOD FOR JEWELRIES

(71) Applicants: Oujie Kevin Tong, Beijing (CN); Yifei Jenny Jin, Beijing (CN); Lisa Ruosha Wang, Belle Mead, NJ (US); Jian Jim Wang, Belle Mead, NJ (US)

(72) Inventors: Oujie Kevin Tong, Beijing (CN); Yifei Jenny Jin, Beijing (CN); Lisa Ruosha Wang, Belle Mead, NJ (US); Jian Jim Wang, Belle Mead, NJ (US)

(73) Assignees: Oujie Kevin Tong, Beijing (CN); Yifei Jenny Jin, Beijing (CN); Lisa Ruosha Wang, Belle Mead, NJ (US); Jian Jim Wang, Belle Mead, NJ (US)

( * ) Notice: Subject to any disclaimer, the term of this patent is extended or adjusted under 35 U.S.C. 154(b) by 0 days.

(21) Appl. No.: 17/192,591

(22) Filed: Mar. 4, 2021

(51) Int. Cl.
| | | |
|---|---|---|
| *C23C 16/455* | (2006.01) | |
| *A44C 17/00* | (2006.01) | |
| *C23C 16/40* | (2006.01) | |
| *C23C 16/02* | (2006.01) | |

(52) U.S. Cl.
CPC ........ *A44C 17/005* (2013.01); *C23C 16/0227* (2013.01); *C23C 16/403* (2013.01); *C23C 16/45529* (2013.01)

(58) Field of Classification Search
None
See application file for complete search history.

(56) References Cited

U.S. PATENT DOCUMENTS

| | | | |
|---|---|---|---|
| 6,997,014 B2 | 2/2006 | Starcke et al. | |
| 7,128,974 B2 | 10/2006 | Scarsbrook et al. | |
| 7,526,928 B1 | 5/2009 | Kearnes et al. | |
| 8,071,066 B1 | 12/2011 | Laor | |
| 2005/0268852 A1* | 12/2005 | Hatanaka | C23C 16/45525 118/723 VE |
| 2006/0068106 A1 | 3/2006 | Starcke et al. | |
| 2006/0182883 A1* | 8/2006 | Neogi | C04B 41/009 427/240 |
| 2007/0157666 A1 | 7/2007 | Starcke et al. | |
| 2009/0004386 A1* | 1/2009 | Makela | A44C 27/005 427/255.19 |
| 2012/0218638 A1 | 8/2012 | Maula et al. | |
| 2013/0130044 A1 | 5/2013 | Maula et al. | |

(Continued)

OTHER PUBLICATIONS

L. Addadi and S. Weiner, "A pavement of pearl", Nature, vol. 389, Oct. 30, 1997.

(Continued)

*Primary Examiner* — Joel G Horning
(74) *Attorney, Agent, or Firm* — Treasure IP Group, LLC (57) ABSTRACT

A flexible method to provide a variety of value-added coatings to a piece of jewelry or a group of jewelries is disclosed. Atomic Layer Deposition (ALD) and Molecular Layer Deposition (MLD) technique is implemented to deposit a layer of conformal coating on intended jewelry surfaces, including both exterior and interior surfaces, to enhance a vast majority of process-driven or end of use driven properties. The coating compositions include dielectrics material, metals, organic materials or organic-inorganic hybrid materials. The method steps of forming a layer of coating are straightforward and can be tailed to different purposes.

12 Claims, 4 Drawing Sheets

(56) References Cited

U.S. PATENT DOCUMENTS

2016/0270494 A1* 9/2016 Huynh .................. A44C 17/04

OTHER PUBLICATIONS

Schaffer, T. E. et al. Chem. Mater. 9, 1731-1740 (1997).

Alex Scott, How synthesized precious gems are passing as natural, Jan. 30, 2017, Appeared in vol. 95, Issue 5.

Shane F. McClure, Robert E. Kane, and Nicholas Sturman, Gemstone Enhancement and Its Detection in the 2000S, Gems & Gemology, vol. 46, No. 3, pp. 218-240. (2010).

Russell Shor, From Single Source to Global Free Market: The Transformation of the Cultured Pearl Industry, Gems & Gemology, vol. 43, No. 3, pp. 200-226. (2007).

Xiaojun Liu, Jiale Li, Liang Xiang, Juan Sun, Guilan Zheng, Guiyou Zhang, Hongzhong Wang, Liping Xie and Rongqing Zhang, The role of matrix proteins in the control of nacreous layer deposition during pearl formation, Proc. R. Soc. B (2012) 279, 1000-1007.

Benjamin Mariea, Caroline Jouberta, Alexandre Tayaléa, Isabelle Zanella-Cléonc, Corinne Belliarda, David Piquemaid, Nathalie Cochennec-Laureaua,e, Frédéric Marinb, Yannick Gueguena, and Caroline Montagnani, 20986-20991, Different secretory repertoires control the biomineralization processes of prism and nacre deposition of the pearl oyster shell, PNAS, Dec. 18, 2012, vol. 109, No. 51.

Alberto Pe'rez-Huerta, Jean-Pierre Cuif, Yannicke Dauphin and Maggie Cusack, Crystallography of calcite in pearls, Aug. 2014, European Journal of Mineralogy 26(4), 2390.

Chapter 4—Fabrication and characterization of natural/synthesized, micro-, and nanostructured materials for biomedical applications, Nanostructures for Novel Therapy Synthesis, Characterization and Applications Micro and Nano Technologies, 2017, pp. 81-106.

Pia Sundberg and Maarit Karppinen, Organic and inorganic-organic thin film structures by molecular layer deposition: A review, Beilstein J. Nanotechnol. 2014, 5, 1104-1136.

Peter Ozaveshe Oviroh, Rokhsareh Akbarzadeh, Dongqing Pan, Rigardt Alfred Maarten Coetzee & Tien-Chien Jen (2019), New development of atomic layer deposition: processes, methods and applications, Science and Technology of Advanced Materials, 20:1, 465-496.

Laura Keskivali, Matti Putkonen, Eini Puhakka, Eija Kentta, Jeroen Kint, Ranjith K. Ramachandran, Christophe Detavernier, and Pekka Simell, Molecular Layer Deposition Using Ring-Opening Reactions: Molecular Modeling of the Film Growth and the Effects of Hydrogen Peroxide, ACS Omega 2018, 3, 7141-7149.

Steven M. George, Byunghoon Yoon, Molecular Layer Deposition of Organic and Hybrid Organic-Inorganic Polymers, Material Matters 2008, 3.2, 34.

G.L. Doll, B.A. Mensah, H. Mohseni, and T.W. Scharf, Chemical Vapor Deposition and Atomic Layer Deposition of Coatings for Mechanical Applications, 510—vol. 19(1-2), Jan. 2010 Journal of Thermal Spray Technology.

D. Ari, et al., SiO thin film growth through a pure atomic layer deposition technique at room temperature, RSC Advances, DOI link: https://doi.org/10.1039/D0RA01602K.

Taewook Nam, et. al., Low-temperature Atomic Layer Deposition of TiO2, Al2O3, and ZnO Thin Films, Journal of the Korean Physical Society, vol. 59, No. 2, Aug. 2011, pp. 452~457.

M. D. Groner, et. al., Low-Temperature Al2O3 Atomic Layer Deposition, Chem. Mater. 2004, 16, 639-645.

Doll, G.L., Mensah, B.A., Mohseni, H. et al. Chemical Vapor Deposition and Atomic Layer Deposition of Coatings for Mechanical Applications. J Therm Spray Tech 19, 510-516 (2010).

Peter Ozaveshe Oviroh et. al, New development of atomic layer deposition: processes, methods and applications, Science and Technology of Advanced Materials, 2019, vol. 20, No. 1, 465-496.

Jie Huang, et al., Organic-inorganic hybrid semiconductor thin films deposited using molecular-atomic layer deposition (MALD), Journal of Materials Chemistry C, Mar. 28, 2016, Issue 12.

* cited by examiner

COATING COMPOSITIONS AND METHOD FOR JEWELRIES

CROSS REFERENCE

Present invention takes priority from a provisional application 62/706,993, filed on Sep. 23, 2020. The provisional application is incorporated herein in its entirety.

TECHNICAL FIELD

The present invention relates to high performance coatings for jewelries, including decorative and protective coatings. Especially the present invention relates to a decorative and protective coating and a method for forming the same on a piece of jewelry including a pearl.

BACKGROUND OF THE INVENTION

Almost everyone in a life time owns a piece of jewelry. Some owns a jewelry, because how it looks. In another words, the atheistic value of a piece of jewelry helps people to express oneself, to complete an outfit, and/or to make a statement. Some owns a piece of jewelry because of its sentimental value. The atheistic values of jewelries demand more optical properties and customary effects. The sentimental values of the calls for jewelry with elongated lifetime.

Nowadays, pearls have become a very popular piece of Jewelry. Pearls are made of bio-organic and inorganic materials with micro- and nano-structured composition. However, evidence have shown that peals degrade and have composition loss if staying long time at temperature higher than 50 degree C. and/or subject to long exposure in dry environment). Pearls are known not only susceptible for medium to high temperature conations and humidity environment, but are prone to surface scratching, venerable for any chemical vapors or weak acids. Therefore, pearls without protective coatings require gentle handling, controlled environment and meticulous protection during wearing and storage.

Currently, when making pearls jewelry, virgin pearls are rubbed with a thin layer of wax or lacquer, which traditionally known to offer some environmental protection to them. Up to today, this purported protective coating is applied by rubbing the pearls within a mixture of corn kernels, which are pre-treated with wax or lacquer. During this rubbing-like surface treatment process, it is hoped that a thin layer of lacquer is transferred onto the surface of the pearls in an uncontrolled manner. However, due to pearls' complicated surface structures with micro- and nano-features, the protective coating is not able to cover or conform well enough with all the exposed surfaces, let alone to reach in interior surfaces. Such surface treatment process is not only suboptimal, more importantly, it doesn't not accommodate other coating materials to potentially enhance pearls esthetic and sentimental values.

Due to the foregoing and possibly additional problems, an improved coating composition, methods for depositing the coatings more uniform to intended surface of a piece of jewelry will be useful contributions to the arts. Further, in view of the foregoing, a more flexible but controlled process that can producing pearls, or jewelries in general, with customary surface properties in a predictable manner is needed.

SUMMARY OF THE INVENTION

The present invention discloses a flexible method to provide a variety of value-added coatings to a piece of jewelry or a group of jewelries. Atomic Layer Deposition (ALD) and Molecular Layer Deposition (MLD) technique is implemented to deposit a layer of conformal coating on target jewelry surfaces, including both exterior and interior surfaces, to enhance a vast majority of process-driven or end of use driven properties. The coating compositions include dielectrics material, metals, organic materials or organic-inorganic hybrid materials. The method steps of forming a layer of coating are programmable controlled and can be tailed to different purposes.

It is one object of the present invention, to provide a piece of jewelry with valued added surface properties, including but not limited to, improved chemical resistance, better abrasion or scratch resistance, and better environment and weather resistance. The jewelries having valued added properties offers prolonged shelf lifetime thus enhance the sentimental values.

It is another object of the present invention, to provide a piece of jewelry with refined or customized aesthetic properties. The refined or customized aesthetic properties includes but are not limited to have different pigment coatings, or a clear coating but with more surface optical properties, even having a selective pattern. The jewelries having refined or customized aesthetic properties potentially offers a variety of boosted esthetical values with unique design.

It is still another object of the present invention, to provide a flexible method to accommodate a wide variety of a material choice for deposition; further the deposition process can handle very delicate substrate material; more over the deposition condition can be mild as ambient temperature. The coating deposition process is easy to use and can be scaled or programmed for future high throughput or tailored process development.

It is yet another object of the present invention, to provide a method accommodating as well as high yield. The coating process can potentially cure defects on surfaces of jewelry so that the overall yield of the jewelry making process is improved.

It is yet another object of the present invention, to provide a method which is a drop-in process. It can be fitted into any step of the jewelry assemble process. For example, the jewelry component elements can be coated first before the assembly, or the coating process can occur after the all the jewelry component elements are assembled.

It is yet another object of the present invention, to provide a method accommodating as well as high yield. The coating process can potentially cure defects on surfaces of jewelry so that the overall yield of the jewelry making process is improved.

According to a first aspect of the present invention, a method to deposit a conformal layer of value-added coating to a target surface of a piece of jewelry is disclosed and described.

In one variation, according to the first aspect of the present invention, a method to deposit a layer of value-added film on a jewelry assembly comprising a pearl by Atomic Layer Deposition (ALD) is described. The method of depositing a conformal layer of coating to pearl comprising cleaning the jewelry assembly and preparing jewelry assembly in a substrate holder in a deposition chamber; setting a temperature control on the substrate holder to be a temperature between 20° C. to 50° C.; transferring deposition material into the deposition chamber and performing one deposition cycle; forming a layer of value-added coating on the target surface of a jewelry assembly.

In another variation, according to the first aspect of the present invention, a method to deposit a layer of value-added film on a jewelry assembly comprising a pearl by Molecular Layer Deposition (MLD) is described. The method of depositing a conformal layer of coating to jewelry assembly comprising cleaning the jewelry assembly and preparing jewelry assembly in a substrate holder in a deposition chamber; setting a temperature control on the substrate holder to be a temperature between 20° C. to 50° C.; transferring deposition material into the deposition chamber and performing one deposition cycle; forming a layer of value-added coating on the target surface of a jewelry assembly.

In still another variation, according to the first aspect of the present invention, a method to deposit multi-layer of value-added films on a jewelry assembly comprising a pearl by a combination of Atomic Layer Deposition (ALD) and Molecular Layer Deposition (MLD) is described. The method using atomic layer deposition to simultaneously deposit a layer of a first material on first and second surfaces of a jewelry component, wherein the first surface is an exterior surface and second surface is interior surface for example a surface of a trench.

In some embodiments, the method using atomic layer deposition to simultaneously deposit a layer of a first material on first and second surfaces of a jewelry component, wherein the first surface is an exterior surface and second surface is interior surface for example a surface of a trench.

In another embodiments, the invention features a method for forming a film on a substrate comprising a curved surface, including forming a layer of a first material by sequentially depositing a plurality of monolayers of the first material, one of the monolayers of the first material being deposited on the curved surface of the substrate, wherein the film comprises the layer of the first material.

In another embodiments, the invention features a method, including using atomic layer deposition to deposit multi-layer films on a plurality surfaces of a jewelry assembly comprising a more than one type of substrate. In one example one type of the surface is a metallic surface and the other is a surface of pearl. In another example, one type is a pearl surface and the other is silk wire.

In still another embodiment, the invention features a method, including using atomic layer deposition to deposit multilayer films on a plurality surfaces, wherein the film thickness is controlled by the number of the deposition cycles. The thickness of films formed on the coating the surfaces is a single monolayer or atomic layer (about 1 Å), a few layers around 0.1 to 1 nm, or 1 nm to 100 nm or more.

According to a second aspect of the present invention, a jewelry assembly comprising a value-added coating is described. The jewelry assembly comprises a pearl, the valued added thin film, having compositions are selected from dielectrics material, metals, organic materials or organic-inorganic hybrid materials. The value-added coating has a layer thickness of a single monolayer or atomic layer (about 1 Å); a few layers at 0.1 to 1 nm or 1 nm to 100 nm or more, wherein the value-added thin film is deposited to the pearl surface by ALD (atomic layer deposition), MLD (molecular layer deposition) or a combination of the two.

In one variation, the value-added thin film coating is located on an exterior surface of the pearl in the jewelry assembly. In another variation, the value-added thin film coating is located on an exterior surface of the pearl. In one example, the value-added coating is located in a trench of the pearl surface of the jewelry assembly.

The invention has advantages including but not limited to providing one or more of the following features. Comparing to other coating techniques the method, the method and article disclosed herein offers a precision method to surface modify a piece of a jewelry, to achieve and enhance aesthetic, sentimental and function values of the jewelry.

BRIEF DESCRIPTION OF THE DRAWINGS

The present invention will be more clearly understood from consideration of the description and drawings in which.

References in the detailed description correspond to like references in the various drawings unless otherwise noted. Descriptive and directional terms used in the written description such as up, down, horizontal, vertical, upper, side, et cetera; refer to the drawings themselves as laid out on the paper and not to physical limitations of the invention unless specifically noted. The drawings are not to scale, and some features of embodiments shown and discussed are simplified or amplified for illustrating principles and features as well as advantages of the invention.

DESCRIPTION OF PREFERRED EMBODIMENTS

While the making and using of various exemplary embodiments of the invention are discussed herein, it should be appreciated that the apparatus and techniques for its use exemplify inventive concepts which can be embodied in a wide variety of specific contexts. It should be understood that the invention may be practiced in various applications and embodiments without altering the principles of the invention. For purposes of clarity, detailed descriptions of functions, components, and systems familiar to those skilled in the applicable arts are not included. In general, the invention provides apparatus, systems, and methods for moving and orienting remote objects. The invention is described in the context of representative example embodiments. Although variations and alternatives for the details of the embodiments are possible, each has one or more advantages over the prior art.

Value Added Coating

The present invention provides a high technical method and process to achieve surface modification. Pearls or other jewelries are quite susceptible to surface scratch, high temperature, and/or chemicals like acid and/or high dryness and/or humidity environment. Therefore, a valued added coating, including surface protective coating, optical coating, adhesion resistance coating, chemical resistant coating, abrasion resistance coating and scratch resistance coating, can truly enhance a piece of jewelry's service lifetime and value.

Atomic Layer Deposition (ALD) or Molecular Layer Deposition (MLD)

Atomic layer deposition (ALD) or Molecular Layer Deposition (MLD) or a combination of ALD with MLD is a coating technology which was recently developed in the past three decades. They could coat a very conformal (which can conform to structures like trenches, gaps, over 100:1 aspect-ratio), down to nanostructure precision in term of conformality and materials options (dielectric or metal or organic or a hybrid inorganic with organic thin film(s) at a low temperature close to room temperature. Such coatings can be very conformal to the nano-structured surface of pearls and also very robust and durable. Meanwhile, beside conformal nature with good durability improvement, we can also utilize such coatings to introduce additional functionality such as adding a color and certain optical functions, and/or improving the smoothness and luster of the pearls' surface.

Figure 1:
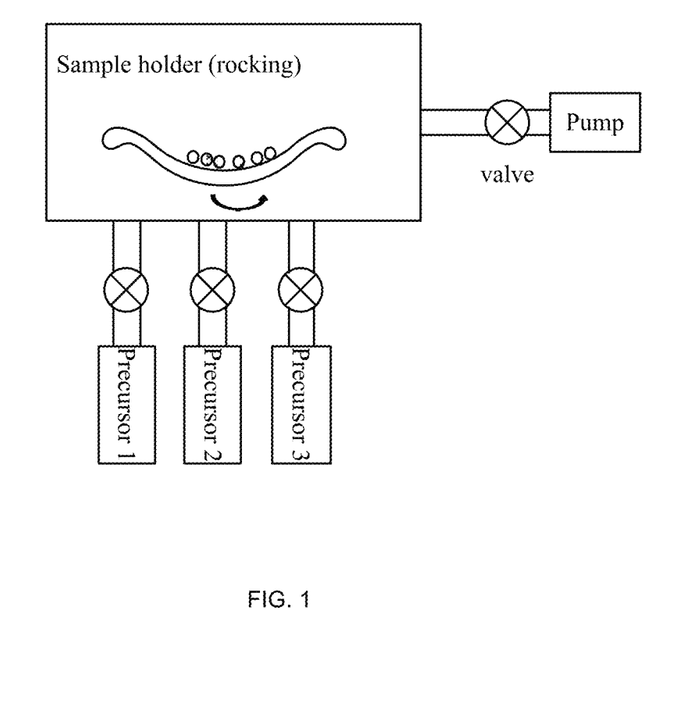
FIG. 1 is a schematic illustration of equipment set up for ALD thin film deposition, in accordance with the aspects of the present invention.

For simplicity purpose, with the scope of the present invention, of ALD with MLD is designed to Atomic layer deposition (ALD) or Molecular Layer Deposition (MLD). Each ALD or MLD is implemented in deposition cycles. An example deposition cycle is shown in FIG. 1. Each deposition cycle comprises the following steps:
(1) injecting a first precursor for a first period;
(2) purging the deposition chamber;
(3) injecting a second precursor for a second period; and
(4) purging the deposition chamber.
  wherein first and second period are less than 1-5 seconds, each complete deposition cycle lasts less than 10 seconds and a growth rate for a layer is around 0.1 nm/cycle to 1 nm/cycle.

The ALD/MLD deposition is a digital deposition process, growing one atomic (or molecular) layer per cycle. The growth rate is typically around 0.1 nm/cycle to 1 nm/cycle. The total deposition time depends on total cycle number for the whole deposition process. It can be a few cycles to tens of cycles to hundreds of cycles or more.

During coating, two or more chemical vapors or gaseous precursors react sequentially on the substrate surface, producing a solid thin film (referring to FIG. 1). Most ALD coating systems utilize a flow-through traveling wave setup, where an inert carrier gas flows through the system and precursors are injected as very short pulses into this carrier flow. The carrier gas flow takes the precursor pulses as sequential "waves" through the reaction chamber, followed by a pumping line, filtering systems and, eventually, a vacuum pump.

Atomic layer deposition (ALD) or Molecular Layer Deposition (MLD) or a combination of ALD with MLD is a coating technology which was recently developed in the past three decades. They could coat a very conformal (which can conform to structures like trenches, gaps, over 100:1 aspect-ratio), down to nanostructure precision in term of conformality and materials options (dielectric or metal or organic or a hybrid inorganic with organic thin film(s)) at a low temperature close to room temperature. Such coatings can be very conformal to the nano-structured surface of pearls and also very robust and durable. Meanwhile, beside conformal nature with good durability improvement, we can also utilize such coatings to introduce additional functionality such as adding a color and certain optical functions, and/or improving the smoothness and luster of the pearls' surface.

In accordance with the first aspect of the present invention, in one variation, a method to deposit a layer of value-added film on a jewelry assembly comprising a pearl by Atomic Layer Deposition (ALD) is described. The method of depositing a conformal layer of coating to pearl comprising cleaning the jewelry assembly and preparing jewelry assembly in a substrate holder in a deposition chamber; setting a temperature control on the substrate holder to be a temperature between 20° C. to 50° C.; transferring deposition material into the deposition chamber and performing one deposition cycle; forming a layer of value-added coating on the target surface of a jewelry assembly.

Molecular layer deposition (MLD) is a vapor phase thin film deposition technique based on self-limiting surface reactions carried out in a sequential manner. Essentially, MLD resembles the well-established technique of atomic layer deposition (ALD) but, whereas ALD is limited to exclusively inorganic coatings, the precursor chemistry in MLD can use small, bifunctional organic molecules as well. This enables, as well as the growth of organic layers in a process similar to polymerization, the linking of both types of building blocks together in a controlled way to build up organic-inorganic hybrid materials.

In another variation, according to the first aspect of the present invention, a method to deposit a layer of value-added film on a jewelry assembly comprising a pearl by Molecular Layer Deposition (MLD) is described. The method of depositing a conformal layer of coating to jewelry assembly comprising cleaning the jewelry assembly and preparing jewelry assembly in a substrate holder in a deposition chamber; setting a temperature control on the substrate holder to be a temperature between 20° C. to 50° C.; transferring deposition material into the deposition chamber and performing one deposition cycle; forming a layer of value-added coating on the target surface of a jewelry assembly.

Even though MLD is a known technique in the thin film deposition sector, due to its relative youth it is not as explored as its inorganic counterpart, ALD, and a wide sector development is expected in the upcoming years.

In still another variation, according to the first aspect of the present invention, a method to deposit multi-layer of value-added films on a jewelry assembly comprising a pearl by a combination of Atomic Layer Deposition (ALD) and Molecular Layer Deposition (MLD) is described.

Figure 2:
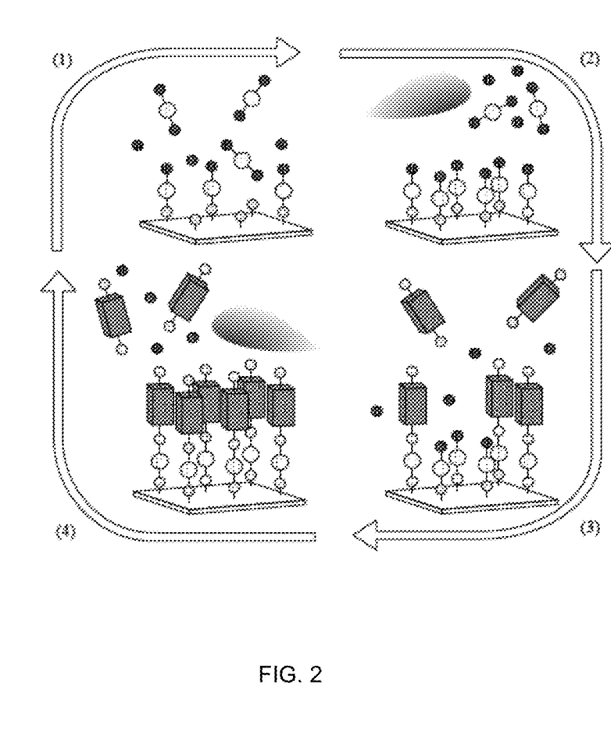
FIG. 2 is a schematic illustration of a first exemplar embodiment of the value-added thin film deposition process, in accordance with the aspects of the present invention.

Referring to FIG. 2, an ALD and MLD combined coating process comprises the following four steps: (1) the first (inorganic) precursor is pulsed to the reactor and it reacts with the surface species;
(2) the excess precursor and possible byproducts are removed from the reactor, either by purging with inert gas such as nitrogen or argon, or by evacuation;
(3) the second (organic) precursor is pulsed to the reactor and it reacts with the surface species; and finally
(4) the excess precursor/possible byproducts are removed from the reactor. In an ideal case a monolayer of a hybrid inorganic-organic material is formed.

To deposit thicker films this basic ALD/MLD cycle is repeated as many times as needed to reach the targeted film thickness.

Comparing to conventional coating technologies, in the present invention, ALD, and MLD, alone or in combination, is an enabling technology for new and improved applications for jewelry surface modifications. It provides coatings and material features which either cannot be achieved cost-efficiently with existing techniques, or they cannot be achieved at all. ALD, as a thin film coating method, offers, precise control of the film thickness, at true nanometer scale; pinhole-free films for, e.g., superior barriers and surface passivation; conformal coating of batches, large-area substrates and complex 3D objects, including porous bulk materials, as well as powders; engineered and new functional materials and structures, such as nanolaminates; and a highly repeatable and scalable process.

The method using atomic layer deposition to simultaneously deposit a layer of a first material on first and second surfaces of a jewelry component, wherein the first surface is an exterior surface and second surface is interior surface, for example a surface of a trench.

Surface Modification Capability

Pearls are essentially a hybrid of bio-organic and inorganic material with micro- and nano-structured composition. They are known to be susceptible to high temperatures. It is observed that peals degrade if staying long time at temperature higher than 50-degree C.), dry environment (long exposure in dry environment leads to loss of composition in pearls), surface scratching, some chemicals such as even weak acids, and also require good handling, caring, and protection during wearing and storage.

In one aspect, the coating deposited on pearl surfaces can effectively modify pearls surface properties. In one example, a layer of base film formed from chemisorption of precursors, pearl's surface adhesion is significantly improved, which open doors for a wide variety of many downstream deposition candidates of organic and inorganic materials.

Process Advantage

In another aspect, the processes used in the present invention are based on self-terminating surface reactions, which further enable automatic processing and eliminate the stringent requirement for over-precise dosing and continuous operator attendance. The ALD and MLD process is highly controllable, programmable and predictable. Digital-like sequential growth provides excellent accuracy without an actual burden for extensive in situ feedback or operator attendance. Further because ALD and MLD are surface-controlled reactions, unconditionally conformal coatings are formed on the surface regardless of if the target is dense, porous, tubular, a powder or otherwise complex in shape. For large scale commercial considerations, because the fundamental operation principal and large-scale batch process will be precise-controlled, easy to be scalable and repeatable. Film growth thickness during a single ALD cycle is process specific, but typically about 1 Å (0.1 nm). Additionally, plasma enhanced ALD and MLD can be employed. ALD coating can also be modified by applying plasma to the deposition cycle, e.g., to enable coating with certain metals and low-temperature oxides and nitrides.

Commercial Scalability

For both ALD and MLD, the sources are injected into the chamber in vapor phase. A great variety of chamber sizes can be implemented for different sample sizes. In one example, a chamber at tens of cubic centimeters is used as a small sample for example a pendant or single pearl. In another example, a chamber at several cubic meters is used for a batch process, where hundreds of pieces of jewelry assemblies or thousands of pieces of pearls can be treated together.

Moreover, during the deposition, monitors are installed inside the chambers. The monitors can be sacrificial piece of jewelries or small pieces of silicon wafer or glass substrates. They are used for growth thickness characterization after the deposition.

Further, because of the multiple deposition sources layout, during the MLD and ALD. No need to take out the sample. ALD and MLD deposition process is deposition process with alternative vapor exposures.

Each deposition can hold batch of samples. In principle, we can deposit thousands of pearls in one deposition run.

Target Surfaces

Figure 5:
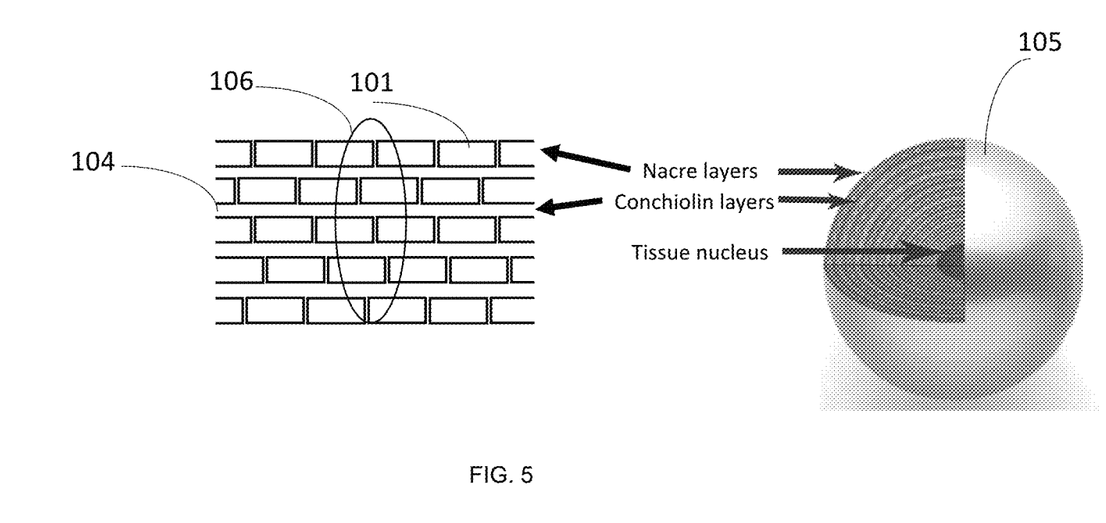
FIG. 5 is a schematic illustration of a pearl structure, having exterior surface, interior surface and trenches.

In some embodiments, the method using atomic layer deposition to simultaneously deposit a layer of a first material on first and second surfaces of a jewelry component, wherein the first surface is an exterior surface 102 and second surface is an interior surface 104. The second surface is either opposite to the first surface, or contiguous to the first surface.

Figure 4:
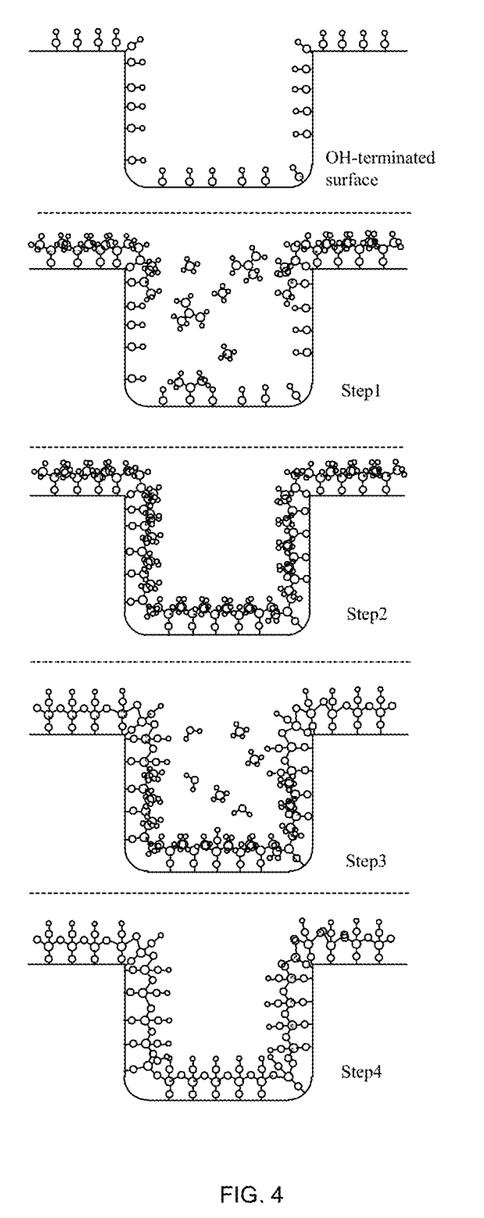
FIG. 4 is a schematic illustration of an exemplar embodiment of ALD deposition system to coat over a trench area, in accordance with the aspects of the present invention.

Pearl is known to have a matrix structure. Because of pearls' complicated natural surface structures with micro- and nano-features, conventional wax or lacquer coating is not able to cover or conform well enough with all the exposed surface or interface of the pearls, for example for a surface of a trench 106. referring to FIG. 4, a conformal coating can amend the trench by naturally filling in the trench when the conformal coating is thick enough.

Figure 3:
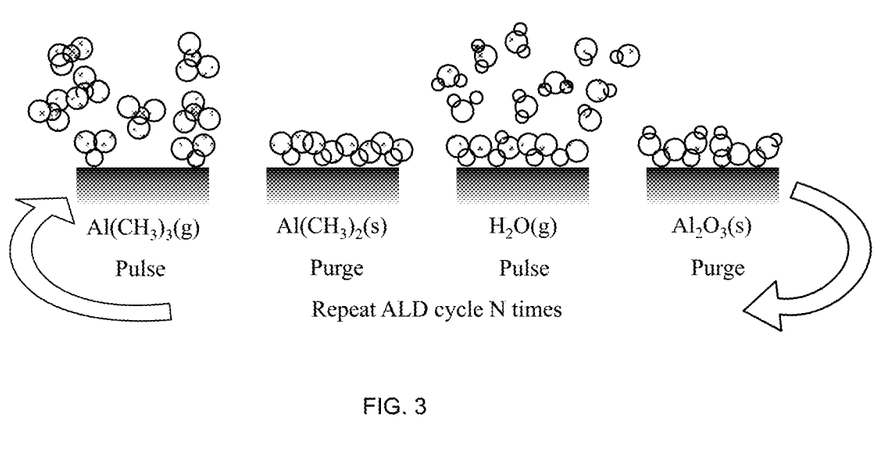
FIG. 3 is a schematic illustration of a second exemplar embodiment of the value-added thin film deposition process, in accordance with the aspects of the present invention.

In one example, referring to FIG. 3, it is a trench, having an aspect ratio 100:1. FIG. 3 is a schematic illustration of one reaction cycle of the ALD process, using the trimethylaluminium (TMA)-water process to make thin aluminum oxide ($Al_2O_3$) films as (simplified) example. and starting substrate surface contains hydroxyls (OH groups) as reactive sites. Step 1 is the reaction of TMA on the trench surface; Step 2 is a purge or evacuation step; Step 3 is the reaction of water; and Step 4 is a purge or evacuation step.

In another embodiments, the invention features a method for forming a film on a substrate comprising a curved surface, including forming a layer of a first material by sequentially depositing a plurality of monolayers of the first material, one of the monolayers of the first material being deposited on the curved surface of the substrate, wherein the film comprises the layer of the first material.

In another embodiments, the invention features a method, including using atomic layer deposition to deposit multilayer films on a plurality surfaces of a jewelry assembly comprising a more than one type of substrate. In one example one type of the surface is a metallic surface and the other is a surface of pearl. In another example, one type is a pearl surface and the other is silk wire.

In still another embodiment, the invention features a method, including using atomic layer deposition to deposit multilayer films on a plurality surfaces, wherein the film thickness is controlled by the number of the deposition cycles. The thickness of films formed on the coating the surfaces is a single monolayer or atomic layer (about 1 Å), a few layers around 0.1 to 1 nm, or 1 nm to 100 nm or more, or 1 micron.

According to a second aspect of the present invention, a jewelry assembly comprising a value-added coating is described. The jewelry assembly comprises a pearl, the valued added thin film, having compositions are selected from dielectrics material, metals, organic materials or organic-inorganic hybrid materials. The value-added coating has a layer thickness of a single monolayer or atomic layer (about 1 Å); a few layers at 0.1 to 1 nm or 1 nm to 100 nm or more, wherein the value-added thin film is deposited to the pearl surface by ALD (atomic layer deposition), MLD (molecular layer deposition) or a combination of the two.

In one variation, the value-added thin film coating is located on an exterior surface of the pearl in the jewelry assembly. In another variation, the value-added thin film coating is located on an exterior surface of the pearl. In one example, the value-added coating is located in a trench of the pearl surface of the jewelry assembly.

In another aspect, the invention features a method for forming a film on a substrate comprising a curved surface, including forming a layer of a first material by sequentially depositing a plurality of monolayers of the first material, one of the monolayers of the first material being deposited on the curved surface of the substrate, wherein the film comprises the layer of the first material.

Rocking Sample Holder

In order for the jewelry component substrate to get a homogenous coating, a movable sample holder is provided. In one embodiment, the invention features a movable sample holder, wherein the sample holder can move laterally, vertically or rotationally during the coating deposition process. In one example, the sample holder is a rocking sample holder like base in the rocking chair. Further the rocking altitude and frequency can be adjusted according to the sizes of the samples.

Substrate Variety

In another embodiment, the invention features a method, including using atomic layer deposition to deposit multi-layer films on a plurality surfaces of a jewelry assembly comprising a more than one type of substrate. In one example one type of the surface is a metallic surface and the other is a surface of pearl. In another example, one type is a pearl surface and the other is silk wire.

Thickness of the Coating

In another embodiment, the invention features a method, including using atomic layer deposition to deposit multi-layer films on a plurality surfaces, wherein the film thickness is controlled by the number of the deposition cycles. In one example, the formed coating the target surfaces is a single monolayer or atomic layer (about 1 Å). In another example to a few layers (around 0.1 to 1 nm) to much thicker (1 nm to 100 nm or more). In some examples the film thickness can be a one or few microns.

Temperature Range

In some embodiments, in the deposition process of the pearl-containing jewelry setting a temperature control on the substrate holder to be a temperature between 20° C. to 50° C. In one example, the temperature is controlled at 20-30° C. In another example, the temperature is controlled at 31-40° C. In still another example, the temperature is controlled at 41-50° C. In still another example, the temperature is controlled at 20-25° C. In yet another example, the temperature is controlled at 25-30° C.

Deposition Materials, Precursors

The material precursors used to form thin films on the jewelry surfaces include dielectrics material, metals, organic materials or organic-inorganic hybrid materials.

The most common materials deposited by ALD includes but are not limited to oxides, nitrides, carbides, metals, sulfides, fluorides, biomaterials and polymers.

A list of oxides includes but is not limited to $Al_2O_3$, CaO, CuO, $Er_2O_3$, $Ga_2O_3$, $HfO_2$, $La_2O_3$, MgO, $Nb_2O_5$, $Sc_2O_3$, $SiO_2$, $Ta_2O_5$, $TiO_2$, VXOY, $Y_2O_3$, $Yb_2O_3$, ZnO, and $ZrO_2$.

A list of nitrides includes but is not limited to AlN, GaN, TaNX, TiAlN, and TiNX. A list of carbides includes but is not limited to TaC, and TiC. A list of metals includes but is not limited to Ir, Pd, Pt, and Ru. A list of sulfides includes but is not limited to ZnS, and SrS. A list of fluorides includes but is not limited to $CaF2$, $LaF3$, $MgF2$, and $SrF2$. A list of biomaterials includes but is not limited to $Ca10(PO4)6(OH)2$ (hydroxyapatite). A list of polymers includes but is not limited to PMDA-DAH, and PMDA-ODA. Doping, nanolaminates and mixed structures includes but is not limited to ALD enables a vast array of material combinations.

A variety of organic precursors can be used for MLD depositions. Organic precursors usually are homo or hetero-bifunctional molecules with —OH, —COOH, —$NH_2$, —$CONH_2$, —CHO, —COCl, —SH, —CNO, —CN, alkenes, etc. functional groups.

Cleaning Before Deposition

Prior to deposition, the pearls are cleaned in standard methods as indicated below:

1) wiping pearls with a soft cloth;
2) cleaning a pearl surface with a damp cloth;
3) mixing a solution of lukewarm water and mild dish soap, dipping a soft cleaning cloth in it and wiping the pearls. Do NOT submerge a pearl necklace in water, as it will weaken the silk thread. Clean pearls with a steam or ultrasonic jewelry cleaner can damage the pearl or causing material loss. Therefore, it should be avoided.
4)) drying the pearl thoroughly at room temperature before deposition. In one example the pearl-containing jewelry assembly further comprising an elastic. strand. The elastic strand is thoroughly dried before deposition too. One way to determine if the pearl or jewelry assembly containing pearl has been thoroughly dried. is to weigh the sample before the cleaning process and weight again after the cleaning process. The difference of the weight before and after, is calculated and compared against an empirical threshold. Once difference of the weight the falls within a target range, the jewelry assembly proceed to the deposition process.

Characterization after Deposition

To characterize the pearls, after the deposition, the pearls will be inspected under optical microscope to check surface condition after deposition. Scanning electron microscope (SEM) can be also used to check the microscopic structures of the deposited films on sacrificial pieces when it is needed.

Other standard pearl characterization methods will also be used, such as visual inspection under magnified glass with strong light illumination, standard cosmetic inspection, surface hardness inspection (needle test).

In accordance with the second aspect of the present invention, a jewelry assembly comprising a value-added coating is described. The jewelry assembly comprises a pearl, the valued added thin film, having compositions selected from dielectrics material, metals, organic materials or organic-inorganic hybrid materials. The value-added coating has a layer thickness of a single monolayer or atomic layer (about 1 Å); a few layers at 0.1 to 1 nm or 1 nm to 100 nm or more, wherein the value-added thin film is deposited to the pearl surface by ALD (atomic layer deposition), MLD (molecular layer deposition) or a combination of the two.

In one variation, the value-added thin film coating is located on an exterior surface of the pearl in the jewelry assembly. In another variation, the value-added thin film coating is located on an exterior surface of the pearl. In one example, the value-added coating is located in a trench of the pearl surface of the jewelry assembly. In one example, the trench has an aspect ratio between 2:1-5:1. In another example, the trench has an aspect ratio between 5:1-10:1. In another example, the trench has an aspect ratio between 10:1-20:1. In another example, the trench has an aspect ratio between 20:1-50:1. In still another example, the trench has an aspect ratio between 50:1-100:1. In still another example, the trench has an aspect ratio between 100:1-200:1.

In some embodiments the jewelry surfaces include surfaces having different surface energy or material compositions for example metallic surface and organic surfaces. Depends on the deposition material, the surface thickness can be different for these surfaces. Further a mask with a pattern or a cover can be applied to the jewelry assembly before the deposition to generate pearls with color patterns or other optical properties.

Example

Prior to deposition, the pearls are visually inspected to remove the pieces having defects. The peal is stranded with a silk wire to form a necklace. The whole necklace is weighed and cleaned in standard methods, by wiping pearls with a soft cloth and followed by cleaning with a damp cloth. After the pearls are dried at room temperature, they are transferred to deposition chamber. Three monitor pieces and one sacrificial piece were transferred to ALD (or MLD) deposition chamber. Three deposition cycles in the following steps were performed: (1) a short (in seconds or less) injection of precursor A; (2) purge the chamber; (3) a short (in seconds or less) injection of precursor B; (4) purge the chamber. So, each complete cycle typically lasts a few seconds in total duration. The growth rate is typically around 0.5 nm/cycle. $Al_2O_3$ is coated by ALD at room temperature (20° C.).

Pearls, after the deposition, were visually inspected first and then inspected under optical microscope to check surface condition after deposition. Scanning electron microscope (SEM) are used to inspect on the sacrificial piece to check the microscopic structures of the deposited films.

Elements in this invention are
101 inorganic exterior layer;
104 organic interior layer;
105 curve surface;
106 trenches.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to explain the principles of the invention and its practical applications, they thereby enable others skilled in the art to utilize the invention and various embodiments with various modifications as are suited to the particular use contemplated. It is intended that the following claims and their equivalents define the scope of the invention.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

The invention claimed is:

1. A method to deposit a conformal layer of value-added coating to a plurality of target surfaces of a jewelry assembly or a jewelry component, comprising cleaning the jewelry assembly or
using a layer deposition to simultaneously deposit a layer of a first material on a plurality of target surfaces, including the first surface and second surface, wherein the first surface is an exterior surface of the jewelry assembly or the jewelry component, comprising
setting a temperature control on the sample holder to be a temperature between 20° C. to 50° C.;
and performing one layer deposition through Molecular Layer Deposition (MLD), and performing more deposition cycles;
forming a layer or multi-layer of a value-added thin film on the plurality of target surfaces of the jewelry assembly or jewelry component.

2. The method of claim 1, wherein the more deposition cycles include Atomic Layer Deposition (ALD), and Molecular Layer Deposition (MLD).

3. The method of claim 1, wherein the second surface is opposite or contiguous to the first surface.

4. The method of claim 1, wherein one of the plurality of target surfaces includes a trench has an aspect ratio of between 20:1-100:1.

5. The method of claim 1, wherein a thickness of the layer or multi-layer of the value-added thin film on the plurality of target surfaces ranges from a single monolayer or atomic layer (about 1 Å), to a few layers around 0.1 to 1 nm.

6. The method of claim 5, wherein the film thickness is controlled by the number of the deposition cycles.

7. The method of claim 5, wherein the compositions of valued added thin film are selected from dielectrics material, metals, organic materials or organic-inorganic hybrid materials.

8. The method of claim 1, wherein forming a film on a substrate comprising a curved surface, including forming a layer of a first material by sequentially depositing a plurality of monolayers of the first material, one of the monolayers of the first material being deposited on the curved surface of the substrate, wherein the film comprises the layer of the first material.

9. The method of claim 1, wherein the plurality of target surfaces includes a metallic surface and a pearl surface.

10. The method of claim 1, wherein each deposition cycle comprising the following steps
(1) injecting a first precursor for a first period;
(2) purging the deposition chamber;
(3) injecting a second precursor for a second period; and
(4) purging the deposition chamber;
wherein the first and second periods are less than five seconds, each complete deposition cycle lasts less than 10 seconds and a growth rate for a layer is around 0.1 nm/cycle to 1 nm/cycle.

11. The method of claim 1, wherein the sample holder is movable, laterally, vertically or rotationally, or a combination of them, capable of turning the sample to expose an exterior surface of the jewelry component to a deposition vapor.

12. The method of claim 1, wherein a thickness of the layer or multi-layer of the value-added thin film on the plurality of target surfaces ranges from 1 nm to 100 nm.

* * * * *